(12) United States Patent
Cui et al.

(10) Patent No.: US 9,825,629 B2
(45) Date of Patent: Nov. 21, 2017

(54) APPARATUS COMPRISING A SWITCH FEATURE

(71) Applicant: Nokia Technologies Oy, Espoo (FI)

(72) Inventors: Zhen Cui, Beijing (CN); Zhigang Chen, Beijing (CN)

(73) Assignee: Nokia Technologies Oy, Espoo (FI)

(*) Notice: Subject to any disclaimer, the term of this patent is extended or adjusted under 35 U.S.C. 154(b) by 0 days.

(21) Appl. No.: 14/890,740

(22) PCT Filed: May 13, 2013

(86) PCT No.: PCT/CN2013/075533
§ 371 (c)(1),
(2) Date: Nov. 12, 2015

(87) PCT Pub. No.: WO2014/183247
PCT Pub. Date: Nov. 20, 2014

(65) Prior Publication Data
US 2016/0099712 A1    Apr. 7, 2016

(51) Int. Cl.
*H03K 17/693* (2006.01)
*G06F 3/00* (2006.01)
*G06F 13/40* (2006.01)

(52) U.S. Cl.
CPC ......... *H03K 17/693* (2013.01); *G06F 3/002* (2013.01); *G06F 13/4068* (2013.01); *G06F 2213/0042* (2013.01); *Y02B 60/1228* (2013.01); *Y02B 60/1235* (2013.01)

(58) Field of Classification Search
None
See application file for complete search history.

(56) References Cited

U.S. PATENT DOCUMENTS

| | | | |
|---|---|---|---|
| 7,241,179 B2 | 7/2007 | Chennakeshu | |
| 7,305,253 B2 | 12/2007 | Snyder et al. | |
| 7,482,853 B2* | 1/2009 | Koch | H03K 17/005 327/407 |
| 8,180,397 B2 | 5/2012 | Stenmark et al. | |
| 8,458,375 B2 | 6/2013 | Sun et al. | |
| 8,542,472 B2* | 9/2013 | Mullins | H01R 24/60 361/86 |
| 8,704,578 B2* | 4/2014 | Kurokawa | H01L 27/0285 327/309 |

(Continued)

FOREIGN PATENT DOCUMENTS

| | | |
|---|---|---|
| CN | 101727428 A | 6/2010 |
| CN | 201758439 U | 3/2011 |

(Continued)

OTHER PUBLICATIONS

International Search Report and Written Opinion for Application No. PCT/CN2013/075533 dated Feb. 20, 2014.

(Continued)

*Primary Examiner* — Thomas J Hiltunen
(74) *Attorney, Agent, or Firm* — Alston & Bird LLP

(57) ABSTRACT

Apparatus comprises a switch feature configured to restrict an electrical signal transmitted from a peripheral device, and received through an electrical contact, from being transferred to one of first and second circuit modules coupled to the electrical contact, depending on the voltage amplitude of the electrical signal.

15 Claims, 5 Drawing Sheets

(56) References Cited

U.S. PATENT DOCUMENTS

| | | | |
|---|---|---|---|
| 8,963,615 B1* | 2/2015 | Abawi | H03K 17/161 |
| | | | 327/415 |
| 9,215,521 B2* | 12/2015 | Lee | H01R 13/66 |
| 9,294,598 B2* | 3/2016 | Yamada | H03K 17/6874 |
| 9,294,857 B2* | 3/2016 | Prentice | H04R 29/004 |
| 2004/0160993 A1* | 8/2004 | Ganton | H04J 7/00 |
| | | | 370/537 |
| 2004/0198442 A1 | 10/2004 | Chan et al. | |
| 2004/0204185 A1 | 10/2004 | Snyder et al. | |
| 2004/0228369 A1* | 11/2004 | Simmons, III | H04Q 11/0471 |
| | | | 370/537 |
| 2008/0270647 A1* | 10/2008 | Shih | G06F 1/266 |
| | | | 710/63 |
| 2012/0200173 A1* | 8/2012 | Liu | G06F 1/1613 |
| | | | 307/116 |
| 2012/0286843 A1 | 11/2012 | Kurokawa | |
| 2013/0138838 A1 | 5/2013 | Kim | |
| 2015/0061646 A1* | 3/2015 | Chia | G01R 31/3277 |
| | | | 324/136 |

FOREIGN PATENT DOCUMENTS

| | | |
|---|---|---|
| CN | 102778918 A | 11/2012 |
| GB | 2443976 A | 5/2008 |
| KR | 2012 0009890 A | 2/2012 |

OTHER PUBLICATIONS

Extended European Search Report for corresponding European Application No. 13884673.8 dated Feb. 6, 2017, 9 pages.

* cited by examiner

Fig. 6
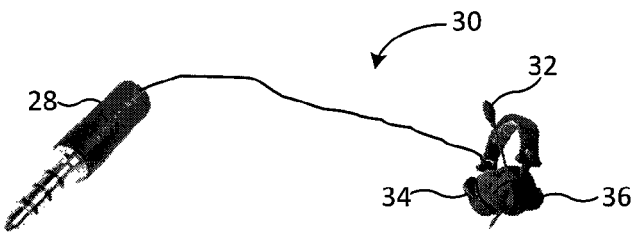
Fig. 6a
| A1/B1 | A2/B2 | A3/B3 | A4/B4 |
|-------|-------|-------|-------|
| GND   | MIC   | R     | L     |
Fig. 7
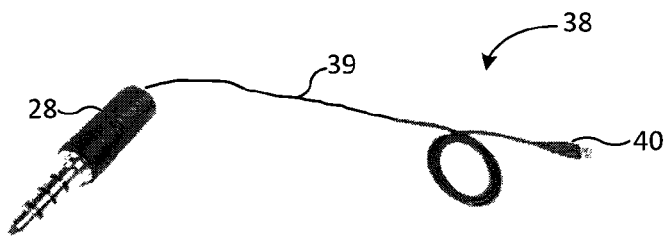
Fig. 7a
| A1/B1 | A2/B2 | A3/B3 | A4/B4 |
|-------|-------|-------|-------|
| GND   | VBUS  | D-    | D+    |
Fig. 8
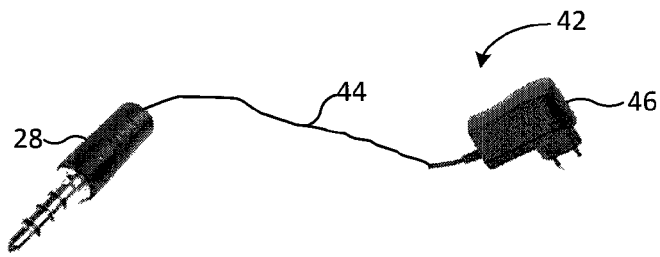
Fig. 8a
| A1/B1 | A2/B2 | A3/B3 | A4/B4 |
|-------|-------|-------|-------|
| GND   | V+    | N/A   | N/A   |

APPARATUS COMPRISING A SWITCH FEATURE

CROSS-REFERENCE TO RELATED APPLICATION

This application is a national phase entry of and claims priority to International Application No. PCT/CN2013/075533, filed May 13, 2013, the entire contents of which are hereby incorporated by reference.

FIELD

This application concerns an apparatus comprising a switch feature.

BACKGROUND

Electronic devices are frequently provided with a plurality of ports for connecting with various types of peripheral devices. For example some electronic devices have multiple ports in the form of a power socket, a headphone socket and a USB port. The present disclosure has been conceived with this in mind.

SUMMARY

In a first aspect, this specification describes apparatus comprising: a switch feature configured to restrict an electrical signal transmitted from a peripheral device, and received through an electrical contact, from being transferred to one of first and second circuit modules coupled to the electrical contact, depending on the voltage amplitude of the electrical signal.

The switch feature may be configured to recoverably restrict an electrical signal transmitted from a peripheral device, and received through an electrical contact, from being transferred to one of first and second circuit modules coupled to the electrical contact, depending on the voltage amplitude of the electrical signal.

The switch feature may comprise first and second channels, and the apparatus may be configured such that, in use, when the electrical signal is received through the electrical contact: the electrical signal enters the first and second channels; and the electrical conductivities of such channels are caused to change relative to one another when the voltage amplitude of the electrical signal exceeds a threshold voltage.

A difference in the electrical conductivities of the first and second channels may increase or decrease when the voltage amplitude of the electrical signal exceeds the threshold voltage.

One of the channels may comprise a trigger unit configured to cause the difference in the electrical conductivities of the first and second channels to change when the voltage amplitude of the electrical signal exceeds the threshold voltage.

The other channel may comprise an insulated gate field effect transistor.

The trigger unit may be coupled to the gate of the insulated gate field effect transistor.

At least part of the voltage magnitude of the electrical signal may be applied to the gate of the field effect transistor when the voltage magnitude of the electrical signal exceeds the threshold voltage.

The apparatus may be configured such that one of the first circuit module and the second circuit module can be coupled to the drain of the insulated gate field effect transistor.

The trigger unit may be a diode.

The threshold voltage may be the breakdown voltage of the diode.

In a second aspect, this specification describes apparatus comprising: the first circuit module; the second circuit module; the electrical contact for receiving an electrical signal from a peripheral device, the electrical contact being coupled to the first and second circuit modules; and the apparatus of any type described with reference to the first aspect.

The apparatus may be configured to recoverably restrict an electrical signal received through the electrical contact from being transferred to one of the circuit modules depending on the voltage amplitude of the electrical signal.

The apparatus may be configured to restrict the electrical signal from being transferred to one of the circuit modules, when the voltage amplitude of the electrical signal exceeds a threshold voltage.

The apparatus may be configured to recoverably restrict the electrical signal from being transferred to one of the circuit modules, when the voltage amplitude of the electrical signal exceeds a threshold voltage.

The electrical contact may comprise one of a plurality of electrical contacts for respectively engaging with corresponding electrical contacts of the peripheral device.

The electrical contacts of the apparatus, or the electrical contacts of the peripheral device, may comprise part of a four-pin socket and the other of said respective sets of electrical contacts may comprise part of a four-conductor plug.

The electrical contacts of the apparatus, or the electrical contacts of the peripheral device, may comprise part of an arrangement configured to receive a four-conductor 3.5 mm plug.

The apparatus may be a portable electronic device.

One of the first circuit module and the second circuit module may comprise a USB circuit module.

One of the first circuit module and the second circuit module may comprise an audio circuit module.

In a third aspect, this specification describes a method comprising: restricting an electrical signal transmitted from a peripheral device, and received through an electrical contact, from being transferred to one of first and second circuit modules coupled to the electrical contact, depending on the voltage amplitude of the electrical signal.

The method may comprise recoverably restricting an electrical signal transmitted from a peripheral device, and received through an electrical contact, from being transferred to one of first and second circuit modules coupled to the electrical contact, depending on the voltage amplitude of the electrical signal.

The method may further comprise causing the electrical conductivities of first and second channels of a switch feature to change relative to one another when the voltage amplitude of the electrical signal exceeds a threshold voltage, the switch feature being arranged such that, in use, when the electrical signal is received through the electrical contact, the electrical signal enters the first and second channels.

A difference in the electrical conductivities of the first and second channels may increase or decrease when the voltage amplitude of the electrical signal exceeds the threshold voltage.

One of the channels may comprise a trigger unit, and the method may further comprise the trigger unit causing the difference in the electrical conductivities of the first and second channels to change when the voltage amplitude of the electrical signal exceeds the threshold voltage.

The other channel may comprise an insulated gate field effect transistor.

The trigger unit may be coupled to the gate of the insulated gate field effect transistor.

The method may further comprise applying at least part of the voltage magnitude of the electrical signal to the gate of the field effect transistor when the voltage magnitude of the electrical signal exceeds the threshold voltage.

The trigger unit may be a diode.

The threshold voltage may be the breakdown voltage of the diode.

In a fourth aspect, this specification describes apparatus comprising means for restricting an electrical signal transmitted from a peripheral device, and received through an electrical contact, from being transferred to one of first and second circuit modules coupled to the electrical contact, depending on the voltage amplitude of the electrical signal.

The means referred to in the previous paragraph may be configured to recoverably restrict an electrical signal transmitted from a peripheral device, and received through an electrical contact, from being transferred to one of first and second circuit modules coupled to the electrical contact, depending on the voltage amplitude of the electrical signal.

In a fifth aspect, this specification describes a method of manufacturing a device, the method comprising: providing a first circuit module; providing a second circuit module; providing an electrical contact for receiving an electrical signal from a peripheral device, and electrically coupling the electrical contact to the first and second circuit modules; and providing an apparatus of any type heretofore described, such that the apparatus is able to restrict an electrical signal, received through the electrical contact, from being transferred to one of the circuit modules, depending on the voltage amplitude of the electrical signal.

BRIEF DESCRIPTION OF THE FIGURES

For a more complete understanding of example embodiments of the present invention, reference is now made to the following description taken in connection with the accompanying drawings in which:

FIG. 6 is a schematic view of a hands free kit;

FIG. 6a shows the functionality of the contacts of the plug in FIG. 6;

FIG. 7 is a schematic view of a USB adaptor;

FIG. 7a shows the functionality of the contacts of the plug in FIG. 7;

FIG. 8 is a schematic view of a charging device;

FIG. 8a shows the functionality of the contacts of the plug in FIG. 8;

DETAILED DESCRIPTION OF PREFERRED EMBODIMENTS

Figure 1:
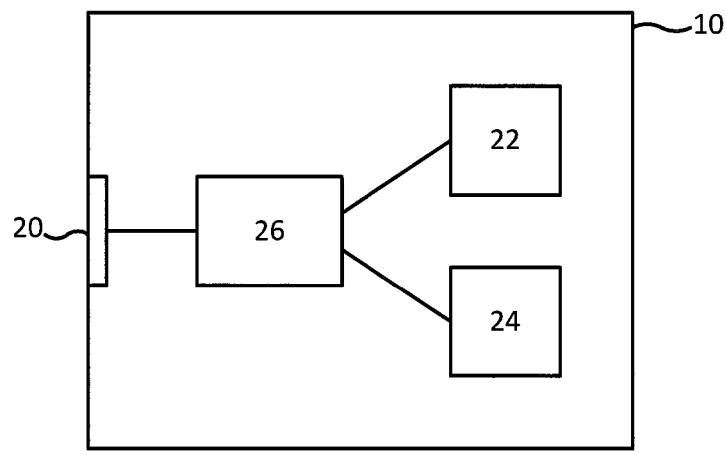
FIG. 1 is a schematic diagram of circuitry within an electronic device.

FIG. 1 shows a simplified schematic diagram of circuitry within an electronic device 10. First and second circuit modules 22, 24 are shown coupled to a port 20 via a switch 26. A peripheral device may be coupled to either the first circuit module 22 or the second circuit module 24 via the port 20. The switch 26 couples such a peripheral device to either the first circuit module 22 or the second circuit module 24 depending on the voltage amplitude of a signal output by the peripheral device and received through the port 20.

The electronic device 10 may be a portable device, such as a laptop computer, a mobile telephone (such as a smart phone), a tablet computer, an electronic reader (i.e. an e-reader), a digital camera, a portable media player, or a video camera among others. The electronic device 10 may alternatively be a static electronic device, for example a desktop computer.

Figure 2:
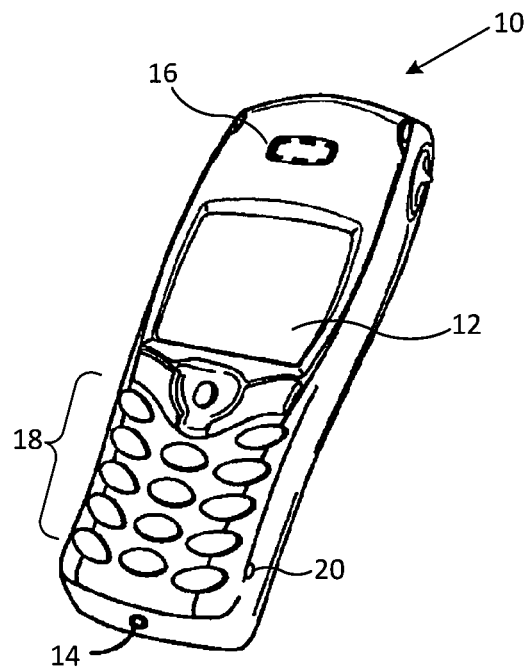
FIG. 2 is a schematic view of an exemplary electronic device.

FIG. 2 shows an example of an electronic device 10 in the form of a mobile phone. The mobile phone 10 comprises standard features that will be familiar to persons skilled in the art. Such standard features include a screen 12, a microphone 14, a speaker 16 and one or more input features 18 (e.g. buttons, a track ball, touch screen functionality etc). The mobile phone 10 is provided with a port 20 for coupling the mobile phone 10 to a peripheral device. Persons skilled in the art will appreciate that the mobile phone 10 may optionally comprise other familiar features, for example a camera or a second screen for instance.

Continuing with the example of the mobile phone in FIG. 2, the port 20 may be used to connect the mobile phone 10 to a charger for charging a battery of the mobile phone 10, for example. Alternatively the port 20 may be used to connect the mobile phone 10 to a USB adaptor for transferring data between the mobile phone 10 and a USB enabled input and/or output device (e.g. a data storage device, personal computer or a printer). The port 20 may also be used to connect the mobile phone 10 to an accessory device such as a hands free kit. The foregoing are merely examples of types of peripheral devices to which the mobile phone 10 may be coupled via the port 20. The port 20 may be used to couple the mobile phone 10 to other types of peripheral devices. This addresses the issue that space is often at a premium in modern day electronic devices such as mobile phones and that as these devices become smaller and thinner this will become more of an issue.

Referring back to FIG. 1, it will be appreciated that other components and interconnections of the electronic device 10 are dependent on the type of device which the electronic device 10 embodies. For example in the context of a mobile phone the device 10 also comprises speaker circuitry and input feature circuitry (e.g. keypad actuation detection circuitry) for instance.

The first circuit module 22 in FIG. 1 may comprise a USB circuit module used in the transference of data between the electronic device 10 and a USB enabled device. The second circuit module 24 may comprise an accessory circuit module used in the transference of signals between the electronic device 10 and an accessory device (for example, but not limited to, a hands free kit). As already mentioned the switch 26 is configured to couple a peripheral device, via the port 20, to either the first circuit module 22 or the second circuit module 24 depending on the voltage amplitude of a signal output by the peripheral device and received through the port 20. In particular, a change in the configuration of the switch 26 is triggered when the voltage magnitude of a signal received through the port 20 exceeds a threshold value.

Figure 3:
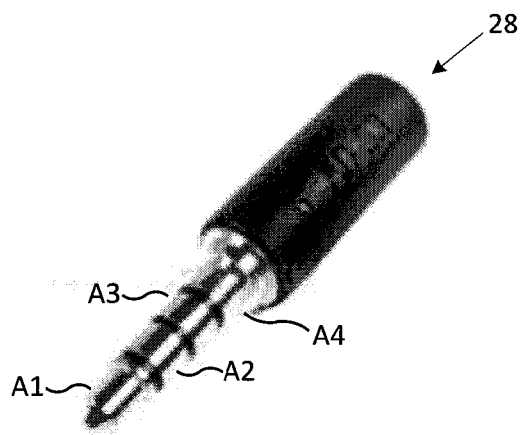
FIG. 3 is a schematic view of a plug.
Figure 4:
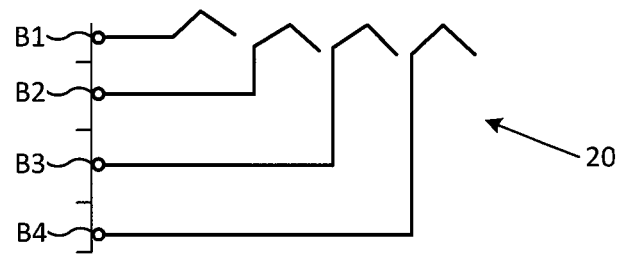
FIG. 4 is a schematic view of a port for receiving the plug in FIG. 3.
Figure 5:
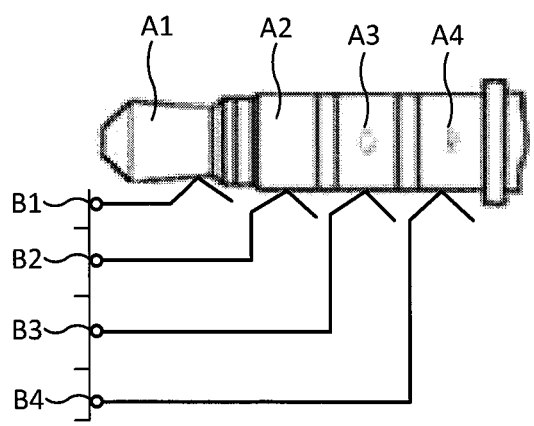
FIG. 5 is a schematic view of the plug in FIG. 3 after being inserted into the port in FIG. 4.

The port 20 of the electronic device 10 in FIG. 1 may comprise a four-pin jack. Such a jack is configured to receive a four-conductor plug 28 of the kind shown in FIG. 3 which may be a standard 3.5 mm plug (although this size is not intended to be limiting and the plug 28 may be of any size provided the four-pin jack is capable of receiving it). The plug 28 comprises four electrically conductive portions referred to hereafter as plug contacts A1 to A4. The plug contacts A1 to A4 are electrically isolated from one another as will be understood by persons skilled in the art. FIG. 4 shows a port 20 configured to receive a plug 28. The port 20 has four electrically conductive portions that are electrically isolated from one another and referred to hereafter as port contacts B1 to B4. The port contacts B1 to B4 are arranged such that when a plug 28 is inserted in the port 20, the plug contacts A1 to A4 and the port contacts B1 to B4 engage one another respectively as in FIG. 5. The electronic device 10, and peripheral devices having a plug 28, transmit signals between one another along electrically conductive channels defined by the engaged plug contacts A1 to A4 and port contacts B1 to B4.

The electronic device 10 is further provided with a detection circuit (not shown) for detecting when a plug 28 has been inserted in the port 20. Detecting whether a plug 28 is inserted in the port 20 may be used for controlling where signals within the electronic device 10 are routed. In the example of a mobile phone for instance, output sound signals are transferred to the speaker 16 (see FIG. 2) when a plug 28 is not inserted in the port 20. However when a plug 28 is inserted in the port 20, and this is detected by the detection circuit, output sound signals are no longer transmitted to the speaker 16 but are instead transferred to one or more of the port contacts B1 to B4. The output sound signals produced by the mobile phone are thus transferred via one or more of the electrical connections with plug contacts A1 to A4 into the peripheral device plugged into the port 20.

A detection circuit of the kind mentioned in the foregoing paragraph may also be used for prompting an electronic device 10 to analyse signals received via the port 20. For instance, detecting when a USB enabled device has been plugged into the port 20 may cause the electronic device 10 to start analysing signals transmitted by the USB enabled device.

A detection circuit for detecting when a plug 28 has been inserted into the port 20 may comprise electrical contacts that are connected (or disconnected) when a plug 28 is inserted into the port 20.

FIG. 6 shows one example of a peripheral device having a plug 28 in the form of a hands free kit 30. The hands free kit 30 comprises a microphone 32, a right speaker 34 and a left speaker 36. When the plug 28 is inserted into the port 20 of an electronic device 10 the plug contact A1 is grounded by coupling to a grounded port contact B1. The plug contact A2 receives output signals from the microphone 32. These signals are transferred to the electronic device 10 via an electrical connection between the plug contact A2 and the port contact B2. The plug contacts A3 and A4 may receive sound signals from the accessory circuit module 24 for the right and left speakers (hereafter R and L sound signals) via electrical connections with port contacts B3 and B4 respectively. Such R and L sound signals are thus transferred to the right and left speakers 34, 36. The plug 28 of the hands free kit 30 may activate a detection circuit of the kind aforementioned when the plug 28 is inserted in the port 20 for the purpose of causing the electronic device 10 to route sound output signals to the port contacts B3 and B4 instead of somewhere else, for example to a speaker. This may be achieved by the plug 28 causing electrical contacts of a detection circuit to engage one another, when the plug 28 is inserted in the port 20. Alternatively this may also be achieved by providing the plug 28 with one or more additional plug contacts for bridging a connection between electrical contacts of a detection circuit when the plug 28 is inserted in the port 20.

FIG. 7 shows another example of a peripheral device having a plug 28 in the form of a USB adaptor 38. The USB adaptor 38 comprises a cable 39 one end of which is provided with a standard USB plug 4o for coupling with the USB port of a USB enabled input and/or output device (e.g. a storage device, a personal computer, a camera or a printer). The other end of the cable 39 is provided with the plug 28 for transferring signals sent via the cable 39 to the electronic device 10. When the plug 28 is inserted into the port 20 of an electronic device 10 the plug contact A1 is grounded upon coupling to a grounded port contact B1. The plug contact A2 receives a DC signal of substantially 5 volts (V) from a USB enabled device coupled to the USB plug 40, through a VBUS line within the cable 39. This DC substantially 5 V signal is transferred to the electronic device 10 via the electrical connection between plug contact A2 and port contact B2. The plug contacts A3 and A4 receive D− and D+ data signals respectively from the USB enabled device through D− and D+ lines within the cable 39. These signals are transferred to the electronic device 10 via electrical connections between contacts A3, B3 and A4, B4.

FIG. 8 shows a further example of a peripheral device having with a plug 28 in the form of a charging device 42. The charging device 42 comprises a cable 44 one end of which is provided with an adaptor 46 for drawing power from a mains supply. The adaptor 46 may be of any suitable form and may comprise a three-pin plug arrangement of the kind commonly used in the UK or a two-pin plug arrangement of the kind commonly used in the US, for instance. The charging device 42 is configured to transfer power drawn from a mains supply to an electronic device 10 via the plug 28 provided on the other end of the cable 44.

Figure 9:
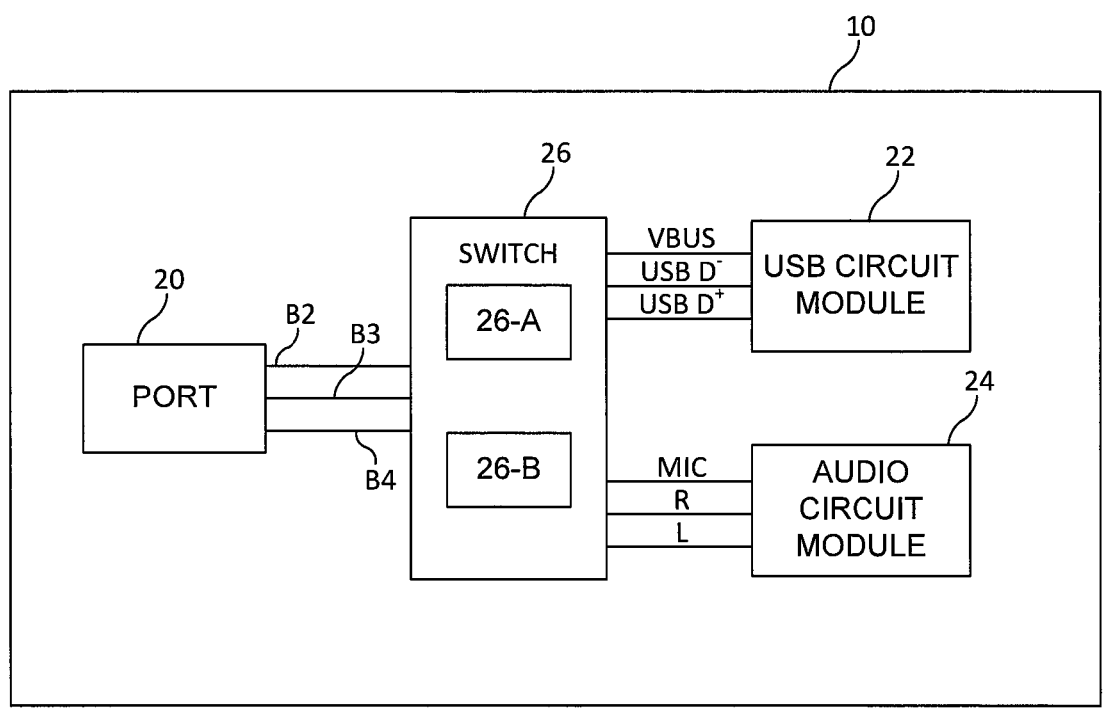
FIG. 9 is a schematic diagram of circuitry within an electronic device that is configured to connect with the peripheral devices shown in FIGS. 6, 7 & 8.

FIG. 9 shows a simplified schematic diagram of circuitry within an electronic device 10 that is configured to connect with each of the peripheral devices in FIGS. 6 to 8. Other components and interconnections are not critical to the teachings of this application and have thus not been shown. The port contacts B2 to B4 are shown coupled to the switch 26. In this particular example the first circuit module 22 comprises a USB circuit module used in the transference of data between the electronic device 10 and a USB enabled input and/or output device, and the second circuit module comprises an audio circuit module 24 (which may include an amplifier).

When the plug 28 of a hands free kit 30 (FIG. 6) is inserted into the port 20 of an electronic device 10 comprising the circuitry in FIG. 9, first switch circuitry 26-A couples the port contacts B3 and B4 to R and L output terminals of the audio circuit module 24. More specifically, sound output signals generated by the electronic device 10 are transferred between the R and L output terminals of the audio circuit module 24 and the right and left speakers 34, 36 of the hands free kit 30 via the respective electrical connections between contacts A3, B3 and A4, B4. Signals generated by the microphone 32 are transferred to the electronic device 10 via the electrical connection between plug contact A2 and port contact B2. Second switch circuitry 26-B causes these signals to be transferred to a microphone signal input terminal (MIC) of the audio circuit module 24 where after they may be processed by microphone signal processing circuitry (not shown) in a manner familiar to persons skilled in the art.

When the USB plug 40 of a USB adaptor 38 (FIG. 7) is connected with a USB enabled device and the plug 28 is inserted into the port 20 of an electronic device 10 comprising the circuitry in FIG. 9, the first switch circuitry 26-A couples the port contacts $B_3$ and B4 to respective terminals of the USB circuit module 22. This enables D− and D+ data signals, transmitted between the electronic device 10 and the USB enabled device, to be transferred through the D− and D+ terminals of the USB circuit module 22 via respective electrical connections between contacts A3, B3 and A4, B4. Furthermore, the DC substantially 5 V signal generated by the USB enabled device is transmitted through a VBUS line within the cable 39 and into the electronic device 10 via the electrical connection between plug contact A2 and port contact B2. The second switch circuitry 26-B causes this signal, referred to hereafter as the VBUS signal, to be transferred to a VBUS terminal of the USB circuit module 22. Persons having knowledge of USB functionality will appreciate how the VBUS signal is used by the USB circuit module 22. The electronic device 10 may, for example, be configured to use the VBUS signal to charge a battery.

When the adaptor 46 of a charging device 42 (FIG. 8) is connected with a mains power supply and the plug 28 is inserted into the port 20 of an electronic device 10 comprising the circuitry in FIG. 9, the DC output V+ of the charging device 42 is used by the electronic device 10 in a similar manner to the VBUS signal referred to in the foregoing paragraph. More specifically DC output V+ of the charging device 42 received by the electronic device 10 through an electrical connection between plug contact A2 and port contact B2 is caused, by the second switch circuitry 26-B, to be transferred along similar circuit lines within the electronic device 10 as the VBUS signal mentioned in the foregoing paragraph. This enables the DC output V+ of the charging device 42 to be used for charging a battery of the electronic device 10 in a similar manner to the VBUS signal generated by a USB enabled device. It will be appreciated that in order for a charging device 42 to be used in this manner the DC voltage output V+ should ideally not exceed 5 V.

Persons skilled in the art will appreciate how the functionality of the first switch circuitry 26-A might be implemented. How the functionality of the second switch circuitry 26-B might be implemented will now be explained in detail.

Figure 10:
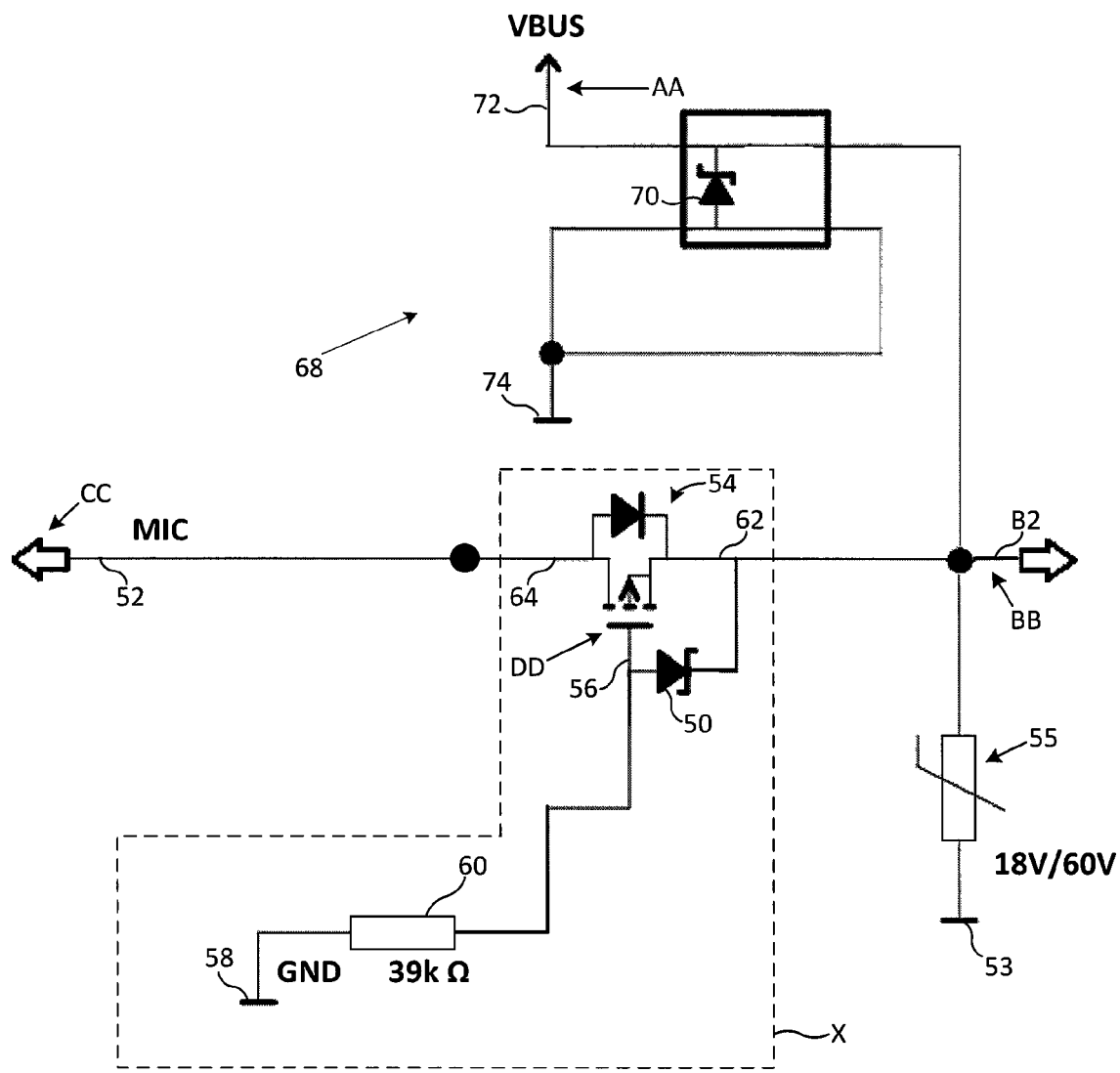
FIG. 10 is a schematic diagram of some circuitry within the switch in FIG. 9.

FIG. 10 illustrates one embodiment of the second switch circuitry 26-B. A first channel couples the output of a VBUS signal output line 72 to the port contact B2 (i.e. the first channel couples the circuit locations labelled AA and BB in FIG. 10). A second channel couples the output of a microphone signal output line 52 to the port contact B2 (i.e. the second channel couples the circuit locations labelled CC and BB in FIG. 10). The second channel has a variable electrical resistance. More specifically, the second channel comprises a switch feature for varying the electrical resistance of the second channel. When a voltage applied to a trigger unit (in this example, a Zener diode 50) exceeds a threshold value, the switch feature causes the electrical resistance of the second channel to change. In the illustrated example the switch feature is a p-channel insulated gate field effect transistor, for example a MOSFET 54.

As will become apparent, the above mentioned trigger unit (in this example, the Zener diode 50) causes the electrical conductivity of the above mentioned switch feature (in this example, the MOSFET 54) to change when a voltage applied to the trigger unit exceeds a threshold value. Causing the electrical conductivity of the switch feature to change thereby causes the electrical conductivity of the second channel to change (the second channel coupling the output of the microphone signal outlet line 52 to the port contact B2).

The gate 56 of the p-channel MOSFET 54 is coupled to a ground terminal 58 via one or more resistors 60. The Zener diode 50 is located between the gate 56 and the source 62 of the p-channel MOSFET 54, the source 62 also being coupled to the port contact B2. Thus when a voltage is applied to the port contact B2 this voltage is transferred to the Zener diode 50. When the voltage applied to the Zener diode 50 is less than the breakdown voltage thereof the gate 56 remains grounded. This enables an electric current to flow between the source 62 and drain 64 of the MOSFET 54. Electrical signals are thus transferable from the port contact B2 to the microphone signal output line 52 which is coupled to the drain 64 of the p-channel MOSFET 54. In other words, when the voltage applied to the Zener diode 50 is less than the breakdown voltage thereof electrical signals are transferable through the second channel (the second channel coupling the output of the microphone signal outlet line 52 to the port contact B2).

When a higher voltage is applied to the port contact B2, again, this voltage is transferred to the Zener diode 50. If this voltage exceeds the breakdown voltage of the Zener diode 50 in the direction of the gate 56 then the Zener diode 50 becomes electrically conductive and the gate 56 is no longer grounded. This is because once the Zener diode 50 becomes electrically conductive at least some of the voltage applied to the port contact B2 is transferred to the gate 56. The proportion of such voltage transferred to the gate 56 depends on the difference between the aforementioned electrical resistance 60, and the electrical resistance of the first channel, relative to one another (the first channel coupling the output of the VBUS output line 72 to the port contact B2). It should be noted that the resistance value shown in FIG. 10 is not intended to be limiting and is provided as a mere example of a suitable resistance value.

In the example shown in FIG. 10, when a positive voltage applied to the port contact B2 exceeds the breakdown voltage of the Zener diode 50 in the direction of the gate 56, the gate 56 of the p-channel MOSFET 54 is caused to become positively charged. This causes the depletion region of the p-channel MOSFET 54 to expand towards the gate 56 which decreases the width of the electrically conductive channel within the MOSFET 54 between the source 62 and drain 64, thereby increasing the electrical resistance of the MOSFET 54. Since the channel within the MOSFET 54 comprises part of the aforementioned second channel, this increases the electrical resistance of the second channel.

In other words applying a positive voltage to the gate 56 of the p-channel MOSFET 54 decreases the electrical conductivity of the channel within the MOSFET 54 between the source 62 and drain 64 thereof. As a result this decreases the electrical conductivity of the second channel (the second channel coupling the output of the microphone signal outlet line 52 to the port contact B2). In this situation electrical signals applied to the port contact B2 are no longer transferable to the microphone signal output line 52 and thus electrical signals are no longer transferable through the second channel.

In another manner of speaking, applying a voltage to the port contact B2 which exceeds the breakdown voltage of the Zener diode 50 in the direction of the gate 56 causes an increase in the electrical conductivity of the channel that couples the gate 56 to the port contact B2 (i.e. the channel that couples the circuit locations labelled DD and BB in FIG. 10), this channel comprising the Zener diode 50. At the same time, applying a voltage to the port contact B2 which exceeds the breakdown voltage of the Zener diode 50 in the direction of the gate 56 causes a decrease in the electrical conductivity of the aforementioned second channel (i.e. the second channel which couples the output of the microphone signal outlet line 52 to the port contact B2). It will be appreciated that it is the increase in electrical conductivity of the Zener diode 50 (which occurs when a voltage applied thereto exceeds its breakdown voltage) which triggers the decrease in electrical conductivity of the second channel.

The switch 26 may be provided with a voltage limiter for limiting the magnitude of the voltage that may be applied along the VBUS output line 72. One such voltage limiter 68 is illustrated in FIG. 10 and persons skilled in the art will understand how this voltage limiter works from inspecting this diagram. In essence, when a voltage is applied to the port contact B2 a voltage is caused to be applied to the Zener diode 70. When the voltage applied to the Zener diode 70 exceeds the breakdown voltage thereof then the port contact B2 is grounded due to the flow of current through the Zener diode 70 towards to the ground terminal 74. This causes the circuit in FIG. 10 to become short circuited such that substantially all of the current flowing through the port contact B2 is directed to the ground terminal 74. The voltage limiter 68 may further comprise a fuse between the port contact B2 and the input of the Zener diode 70 for current surge protection. When a voltage applied to the port contact B2 does not cause a voltage in excess of the breakdown voltage of the Zener diode 70 to become applied to the Zener diode 70 then some of the current travelling into the port contact B2 is directed through the voltage limiter 68 to the output of the VBUS output line 72. In other words, when a voltage applied to the port contact B2 does not cause a voltage in excess of the breakdown voltage of the Zener diode 70 to become applied to the Zener diode 70 then some of the current travelling into the port contact B2 is directed through the first channel (the first channel coupling the output of the VBUS output line 72 to the port contact B2).

With further reference to FIG. 10, the port contact B2 may be coupled to another ground terminal 53 via a varistor 55 for ESD protection. If the voltage applied to the port contact B2 exceeds a predetermined value, then the varisor provides that substantially all of the current entering the electronic device 10 via port contact B2 is directed to the ground terminal 53. Such a predetermined voltage value may range between 8 Volts and 60 Volts. The operational values of the varistor 55 depicted in FIG. 10 are not intended to be limiting and are merely exemplary.

In view of the foregoing, it will be appreciated that the circuit elements within the box labelled X in FIG. 10 essentially comprise a switch feature for restricting an electrical signal received through the port contact B2 from being transferred to the audio circuit module 24 depending on the voltage amplitude of the electrical signal. In the example depicted in FIG. 10, the switch feature X is configured to restrict the electrical signal from being transferred to the audio circuit module 24 when the voltage amplitude of the electrical signal exceeds a threshold voltage.

Reference is once again made to FIG. 9, the functionality of the circuit depicted therein will now be explained in more detail.

When a voltage applied to the port contact B2 is less than the breakdown voltage of the Zener diode 50 then the first switch circuitry 26-A causes plug contacts B3 and B4 to be coupled to the R and L output terminals of the audio circuit module 24. This occurs when the plug 28 of a hands free kit 30 (FIG. 6) is inserted into the port 20. R and L audio output signals are thus transferrable to right and left speakers 34, 36 of the hands free kit 30. The Zener diode 50 of an electronic device 10 configured to enable this functionality may have a breakdown voltage between substantially 3 and 5 Volts. Therefore, the maximum voltage capable of being output by the microphone 32 of a hands free kit 30 configured to enable this functionality is less than substantially 3 to 5 Volts. Skilled persons will appreciate that the maximum voltage capable of being output by the microphone 32 should be less than the threshold voltage of the Zener diode 50. When such a hands free kit 30 is plugged into such an electronic device 10, signals generated by the microphone 32 and received by the electronic device 10 through port contact B2 are caused by the second switch circuitry 26-B to be transferred to the microphone signal output line 52 (FIG. 10) for subsequent processing in a manner familiar to persons skilled in the art. In the context of a mobile phone for instance, signals generated by the microphone 32 are used by the mobile phone for enabling conversation functionality i.e. to enable a user of the mobile phone to speak with the user of another phone. Furthermore, audio output signals are transferred from the audio circuit module 24 to speakers 34, 36.

When a voltage applied to the port contact B2 exceeds the breakdown voltage of the Zener diode 50 then the first switch circuitry 26-B causes plug contacts B3 and B4 to be coupled to the D- and D+ terminals of the USB circuit module 22. This occurs when the USB plug 40 of a USB adaptor 38 (FIG. 7) is connected to a USB enabled input and/or output device and the plug 28 thereof is inserted into the port 20. D- and D+ signals are thus transferrable between the electronic device 10 and the USB enabled device via the USB adaptor 38. This is possible since, as mentioned previously, the Zener diode 50 may have a breakdown voltage between substantially 3 and 5 Volts. However, VBUS signals received by the electronic device 10 through the port contact B2 are substantially V in magnitude, save for minor fluctuations thereof.

Thus when the USB plug 40 of a USB adaptor 38 configured to enable the above functionality is connected to a USB enabled device, and the plug 28 thereof is inserted into the port 20 of an electronic device 10, the switch 26 is triggered. In this situation the first switch circuitry 26-A enables D- and D+ data signals to be transferred to corresponding terminals of the USB circuit module 22, and the second switch circuitry 26-B causes a VBUS signal received by the electronic device 10 via port contact B2 to be transferred to a VBUS terminal of the USB circuit module 22. More specifically, when the switch 26 is triggered in the manner set out in this paragraph, the electrical conductivity of the channel coupling the gate 56 of the MOSFET 54 to the port contact B2 (FIG. 10) is caused to increase as heretofore described. This increases the electrical resistance of the second channel (the second channel coupling the port contact B2 to the output of the microphone signal output line 52). Thus a VBUS signal received by the electronic device 10 via port contact B2 is not transferred through the second channel. The VBUS signal is however transferred through the first channel (the first channel coupling the output of the VBUS output line 72 to the port contact B2). The VBUS, D− and D+ signals are subsequently utilised by the electronic device 10 in a manner familiar to persons skilled in the art who will have knowledge of USB functionality. Essentially these signals are used to transfer data (in either direction) between the electronic device 10 and a USB enabled device coupled to the electronic device 10 via the USB adaptor 38. Furthermore, VBUS signal voltage may be used to charge a battery of the electronic device 10.

As already mentioned, the charging device 42 depicted in FIG. 8 is configured to provide a DC voltage output V+ of substantially 5 V. Thus when the adaptor 46 thereof has been connected to a power supply and the plug 28 is inserted into the port 20 of an electronic device 10, the voltage applied to the port contact B2 exceeds the breakdown voltage of the Zener diode 50. In a similar manner to when the plug 28 of a USB adaptor 38 is inserted into the port 20, the switch 26 is triggered. More specifically, the first switch circuitry 26-A causes plug contacts B3 and B4 to be coupled to the D− and D+ terminals of the USB circuit module 22, and the second switch circuitry 26-B causes the DC voltage output V+ received by the electronic device 10 via port contact B2 to be transferred to the VBUS terminal of the USB circuit module 22 as above. However since the plug 28 of the charging device 42 does not enable the transfer of signals through plug contacts A3 and A4 (or is not provided with such plug contacts) D− and D+ signals are not transferred to or from the USB circuit module 22. In other words, when the plug 28 of a charging device 42 (connected to a power source) is inserted in the port 20, breakdown of the Zener diode 50 causes the DC voltage output V+ of the charging device 42 to be transferred along the VBUS output line 72 of the second switch circuitry 26-B (such DC voltage output V+ is not transferred though the microphone signal output line 52). The DC voltage output V+ is used in a similar manner to the aforementioned VBUS signal for charging a battery of the electronic device 10.

Various alternatives to the foregoing embodiments will now be outlined.

More generally the port 20 comprises a first part of a two-part connection arrangement and comprises a plurality of electrical contacts for coupling with corresponding contacts of a second part of the two-part connection arrangement. The port 20 may thus have fewer or more than four electrical contacts. For example the port 20 may have two electrical contacts one of which is coupled by a switch to either a first circuit module 22 or a second circuit module 24, depending on the voltage magnitude of a signal received via the other electrical contact from a peripheral device. Thus, in some embodiments the port 20 may be configured to connect with a two-conductor plug such as a 2.5 mm or a 3.5 mm plug although these sizes are merely exemplary and are not intended to be limiting. Similarly the plug 28 of a peripheral device configured to connect with a port 20 may be correspondingly adapted. In the case that a port 20 has two electrical contacts for example, the plug 28 of a peripheral device configured to be connected to such a port is provided with at least two electrical contacts for coupling with those of the port.

The electronic device 10 in FIG. 1 has been described as comprising a port 20 into which the plug 28 of a peripheral device may be inserted. However the port 20 of the electronic device 10 may instead be replaced by a plug 28, and the plug 28 of peripheral devices configured to be connected to the electronic device 10 may instead be replaced with a port 20.

The circuit depicted in FIG. 9 need not necessarily comprise a USB circuit module 22 and an audio circuit module 24, and instead one or both of these may be replaced with another type of circuit module. For instance the USB circuit module 22 may alternatively comprise a power circuit module configured to receive power from a peripheral device coupled to the port 20 and may not be configured to implement USB 10 functionality. Such a power circuit module may be used to charge a battery of the electronic device 10 or to simply power the electronic device without charging a battery.

More broadly, the switch 26 may be used to couple a peripheral device to a first circuit module 22 or a second circuit module 24 provided that such circuit modules are respectively configured for use with signals having different voltage magnitudes from a peripheral device coupled to the port 20. For instance, peripheral devices that input one or more signals into the electronic device 10 of a first voltage amplitude may be coupled by the switch 26 to the first circuit module 22. However peripheral devices that input signals into the electronic device 10 of a second voltage amplitude may be coupled by the switch 26 to the second circuit module 24. As mentioned in the previous paragraph such first and second circuit modules may be other than a USB circuit module and an audio circuit module. Such circuit modules may be of any kind and combination provided that one such circuit module is configured for use with signals having a first voltage magnitude from a peripheral device and the other is configured for use with signals having a second, higher, voltage magnitude from a peripheral device.

The insulated gate field effect transistor 54 (which may be a MOSFET) may be of the re-channel variety. The channel between the source and drain of such an n-channel insulated gate field effect transistor is electrically conductive when the gate voltage is positive. The circuit in FIG. 10 may be configured such that the MOSFET 54 is replaced with an n-channel insulated gate field effect transistor and such that when a voltage is not applied to the port contact B2 the gate of the n-channel field effect transistor is positively charged. This may be achieved by replacing the ground terminal 58 with a $V_{CC}$ source. Persons skilled in the art will appreciate that when the gate voltage is reduced or caused to become negative the electrical conductivity of the channel between the source and drain decreases. Thus when a negative voltage more positive than the breakdown voltage of the Zener diode 50 in the direction of the gate is applied to the port contact B2, a signal is capable of being transmitted through the channel between the source and drain of the n-channel insulated gate field effect transistor. However, when a negative voltage more negative than the breakdown voltage of the Zener diode 50 in the direction of the gate is applied to the port contact B2, current flows through the Zener diode 50 and the voltage of the gate is reduced. This causes the depletion region within the n-channel insulated gate field effect transistor to become attracted towards the (less positive or negatively charged) gate thereby reducing the width of the conductive channel between the source and drain. This increases the electrical resistance of the channel between the source and drain such that electrical signals are no longer transferrable between the source and drain.

One or more of the Zener diodes referred to herein may be replaced by another component that becomes electrically conductive when a voltage greater than a threshold amount is applied to it. Furthermore, one or more of the Zener diodes may be replaced with a comparator. Such a comparator may be configured to produce an output when the voltage magnitude of a signal, which is input to the comparator, exceeds a predetermined value. In other words, when a voltage applied to the comparator exceeds a predetermined value, the comparator produces a signal indicative that this has occurred. For example, a comparator may be configured such that an output signal is generated when a signal voltage applied to the comparator exceeds 3 Volts.

As used in this application, the term 'circuitry' refers to all of the following: (a) hardware-only circuit implementations (such as implementations in only analog and/or digital circuitry); (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions); and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

The circuit modules described herein may include "circuitry" as described in the above two paragraphs.

It should be realized that the foregoing embodiments should not be construed as limiting. Other variations and modifications will be apparent to persons skilled in the art upon reading the present application. Moreover, the disclosure of the present application should be understood to include any novel features or any novel combination of features either explicitly or implicitly disclosed herein or any generalization thereof and during the prosecution of the present application or of any application derived therefrom, new claims may be formulated to cover any such features and/or combination of such features.

What is claimed is:

1. Apparatus comprising:
   a first circuit module;
   a second circuit module;
   an electrical contact for receiving an electrical signal from a peripheral device, the electrical contact being coupled to the first and second circuit modules; and
   a switch feature configured to restrict an electrical signal transmitted from a peripheral device, and received through the electrical contact, from being transferred to one of the first and second circuit modules coupled to the electrical contact, depending on the voltage amplitude of the electrical signal, and to transmit the electrical signal to the other one of the first and second circuit modules, wherein the switch feature comprises first and second channels connected to the electrical contact, the apparatus being configured such that, in use, when the electrical signal is received through the electrical contact, the electrical conductivities of such channels are caused to change relative to one another when the voltage amplitude of the electrical signal exceeds a threshold voltage,
   wherein one of the channels comprises a trigger unit configured to cause decreasing of the electrical conductivity of said channel relative to the other channel when the voltage amplitude of the electrical signal exceeds the threshold voltage.

2. The apparatus of claim 1, wherein the channel comprising the trigger unit comprises an insulated gate field effect transistor.

3. The apparatus of claim 2, wherein the trigger unit is coupled to the gate of the insulated gate field effect transistor.

4. The apparatus of claim 3, wherein at least part of the voltage magnitude of the electrical signal is applied to the gate of the field effect transistor when the voltage magnitude of the electrical signal exceeds the threshold voltage.

5. The apparatus of claim 2, wherein the apparatus is configured such that one of the first circuit module and the second circuit module can be coupled to the drain of the insulated gate field effect transistor.

6. The apparatus of claim 1, wherein the trigger unit is a diode.

7. The apparatus of claim 6, wherein the threshold voltage is the breakdown voltage of the diode.

8. The apparatus of claim 1, wherein the electrical contact comprises one of a plurality of electrical contacts for respectively engaging with corresponding electrical contacts of the peripheral device.

9. The apparatus of claim 8, wherein the electrical contacts of the apparatus, or the electrical contacts of the peripheral device, comprise part of a four-pin socket and the other of said respective sets of electrical contacts comprises part of a four-conductor plug.

10. The apparatus of claim 8 wherein the electrical contacts of the apparatus, or the electrical contacts of the peripheral device, comprise part of an arrangement configured to receive a four-conductor 3.5 mm plug.

11. The apparatus of claim 1, wherein the apparatus is a portable electronic device.

12. The apparatus of claim 1, wherein one of the first circuit module and the second circuit module comprises a USB circuit module.

13. The apparatus of claim 1, wherein one of the first circuit module and the second circuit module comprises an audio circuit module.

14. A method comprising:
   restricting, by a switch feature comprising first and second channels connected to an electrical contact, an electrical signal transmitted from a peripheral device, and received through the electrical contact, from being transferred to one of first and second circuit modules coupled to the electrical contact, depending on the voltage amplitude of the electrical signal and transmitting the electrical signal to the other one of the first and second circuit modules,
   wherein electrical conductivities of such channels are caused to change relative to one another when the voltage amplitude of the electrical signal exceeds a threshold voltage using a trigger unit in one of the channels causing decreasing of the electrical conductivity of said channel relative to the other channel when the voltage amplitude of the electrical signal exceeds the threshold voltage.

15. A method of manufacturing a device, the method comprising:
   providing a first circuit module;
   providing a second circuit module;

providing an electrical contact for receiving an electrical signal from a peripheral device, and electrically coupling the electrical contact to the first and second circuit modules; and providing an apparatus comprising a switch feature configured to restrict an electrical signal transmitted from a peripheral device, and received through the electrical contact, from being transferred to one of the first and second circuit modules coupled to the electrical contact, depending on the voltage amplitude of the electrical signal, and to transmit the electrical signal to the other one of the first and second circuit modules, wherein the switch feature comprises first and second channels connected to the electrical contact, the apparatus being configured such that, in use, when the electrical signal is received through the electrical contact, the electrical conductivities of such channels are caused to change relative to one another when the voltage amplitude of the electrical signal exceeds a threshold voltage, wherein one of the channels comprises a trigger unit configured to cause decreasing of the electrical conductivity of said channel relative to the other channel when the voltage amplitude of the electrical signal exceeds the threshold voltage.

* * * * *